(12) United States Patent
Lee et al.

(10) Patent No.: US 9,532,466 B2
(45) Date of Patent: Dec. 27, 2016

(54) METHOD OF MANUFACTURING MULTI-LAYER CIRCUIT BOARD AND MULTI-LAYER CIRCUIT BOARD MANUFACTURED BY USING THE METHOD

(71) Applicant: HAESUNG DS CO., LTD., Changwon-Si (KR)

(72) Inventors: Sang-min Lee, Changwon (KR); Soon-Chul Kwon, Changwon (KR)

(73) Assignee: HAESUNG DS CO., LTD., Changwon-si (KR)

( * ) Notice: Subject to any disclaimer, the term of this patent is extended or adjusted under 35 U.S.C. 154(b) by 75 days.

(21) Appl. No.: 13/658,870

(22) Filed: Oct. 24, 2012

(65) Prior Publication Data
US 2013/0161073 A1 Jun. 27, 2013

(30) Foreign Application Priority Data

Dec. 22, 2011 (KR) .................. 10-2011-0140290
Aug. 29, 2012 (KR) .................. 10-2012-0095173

(51) Int. Cl.
*H05K 3/10* (2006.01)
*H05K 3/46* (2006.01)
(Continued)

(52) U.S. Cl.
CPC .......... *H05K 3/4644* (2013.01); *H05K 3/4652* (2013.01); *H05K 1/0271* (2013.01);
(Continued)

(58) Field of Classification Search
CPC .. H05K 3/4644; H05K 3/4652; H05K 3/0097;
H05K 1/0271; H05K 2201/029; H05K 2201/09136; H05K 2203/0554; H05K 2203/1461; Y10T 29/49126; Y10T 29/49165; Y10T 29/49155
(Continued)

(56) References Cited

U.S. PATENT DOCUMENTS 6,580,036 B2    6/2003  Kim et al.
2004/0091622 A1* 5/2004  Fernandes ............ B29B 15/122
                                                    427/355
(Continued)

FOREIGN PATENT DOCUMENTS

CN   101069459 A      11/2007
DE   2737853 A1 *    3/1979
(Continued)

OTHER PUBLICATIONS

Communication dated Feb. 19, 2016, from the Intellectual Property Office of Taiwan in counterpart application No. 101142750.
(Continued)

*Primary Examiner* — Peter DungBa Vo
*Assistant Examiner* — Azm Parvez
(74) *Attorney, Agent, or Firm* — Sughrue Mion, PLLC

(57) ABSTRACT

A method of manufacturing a multi-layer circuit board includes: forming a first circuit layer on a first surface of a first prepreg; stacking a second prepreg on a first surface of the first circuit layer; and forming at least one of a second or a third circuit layer on at least one of a first surface of the second prepreg and a second surface opposite of the first surface of the first prepreg, wherein, in the stacking of the first prepreg, the first prepreg and the second prepreg are semi-cured.

12 Claims, 6 Drawing Sheets

(51) Int. Cl.
  *H05K 1/02* (2006.01)
  *H05K 3/00* (2006.01)
(52) U.S. Cl.
  CPC ..... *H05K 3/0097* (2013.01); *H05K 2201/029* (2013.01); *H05K 2201/09136* (2013.01); *H05K 2203/0554* (2013.01); *H05K 2203/1461* (2013.01); *Y10T 29/49126* (2015.01); *Y10T 29/49155* (2015.01); *Y10T 29/49165* (2015.01)
(58) Field of Classification Search
  USPC ............. 29/846, 829, 825, 592.1, 847, 831, 852,29/830; 438/400, 478, 761; 174/254, 250, 258, 174/255, 251, 257; 428/416
  See application file for complete search history.

(56) References Cited

U.S. PATENT DOCUMENTS

| | | | | |
|---|---|---|---|---|
| 2004/0214006 | A1* | 10/2004 | Hirayama | H05K 3/4069 428/416 |
| 2004/0241903 | A1 | 12/2004 | Otsuki et al. | |
| 2007/0215381 | A1* | 9/2007 | Vasoya | H05K 3/4641 174/262 |
| 2009/0229862 | A1 | 9/2009 | Nakamura et al. | |
| 2010/0089626 | A1* | 4/2010 | Takano | B32B 15/08 174/257 |
| 2011/0303440 | A1 | 12/2011 | Lim et al. | |
| 2013/0122768 | A1* | 5/2013 | Harada | C08F 222/40 442/179 |
| 2014/0096380 | A1* | 4/2014 | Lim | H05K 1/0203 29/832 |

FOREIGN PATENT DOCUMENTS

| | | |
|---|---|---|
| JP | 10-13019 A | 1/1998 |
| JP | 2000-208937 A | 7/2000 |
| JP | 2004-266131 A | 9/2004 |
| JP | 2011-129563 A | 6/2011 |
| KR | 10-0366411 B1 | 12/2002 |
| KR | 10-1019154 B1 | 3/2011 |
| KR | 10-1044105 B1 | 6/2011 |
| KR | 10-1055571 B1 | 8/2011 |
| TW | 389780 | 5/2000 |

OTHER PUBLICATIONS

Communication dated Aug. 17, 2016, issued by the State Intellectual Property Office of P.R. China in counterpart Chinese Application No. 201210568459.2.
Communication dated Oct. 3, 2016 issued by Japanese Intellectual Property Office in counterpart Japanese Application No. 2012-276746.

* cited by examiner

METHOD OF MANUFACTURING MULTI-LAYER CIRCUIT BOARD AND MULTI-LAYER CIRCUIT BOARD MANUFACTURED BY USING THE METHOD

CROSS-REFERENCE TO RELATED PATENT APPLICATION

This application claims priority from Korean Patent Application No. 10-2011-0140290, filed on Dec. 22, 2011, and Korean Patent Application No. 10-2012-0095173, filed on Aug. 29, 2012 in the Korean Intellectual Property Office, the disclosure of which is incorporated herein by reference in its entirety.

BACKGROUND

1. Field

Methods and apparatuses consistent with exemplary embodiments relate to a circuit board and manufacturing the same, and more particularly, a multi-layer circuit board and manufacturing the multi-layer circuit board.

2. Description of the Related Art

As the electronic industry has recently developed rapidly, a variety of technologies in electronic devices and circuit board fields have been also developed. In particular, as electronic products tend to be lightweight, thin, short, and small, highly functional, and multi-functional, there is a demand for forming fine pitches in circuit boards or having many electronic parts mounted thereon at a high density.

To meet such demand, a multi-layer circuit board that has been recently widely used is a circuit board in which a plurality of circuit boards is stacked as multi-layers and many electronic parts are mounted thereon. The multi-layer circuit board is advantageous in that it may have many electronic parts mounted at a high density, compared to a single-layer circuit board, i.e. a circuit board including a circuit layer formed in one surface or both surfaces thereof.

SUMMARY

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide a method of manufacturing a circuit board capable of preventing warpage from occurring when a multi-layer circuit board is manufactured by generating circuit boards as much as the number of necessary layers, and the circuit board manufactured by using the method.

According to an aspect an exemplary embodiment, there is provided a method of manufacturing a multi-layer circuit board, the method including: forming a first circuit layer on a first surface of a first prepreg; stacking a second prepreg on a first surface of the first circuit layer; and forming at least one of a second and third circuit layer on at least one of a first surface of the second prepreg and a second surface opposite of the first surface of the first prepreg, wherein, in the stacking of the first prepreg, the first prepreg and the second prepreg are semi-cured.

The first prepreg and the second prepreg may include resins having the same viscosity characteristics.

In the stacking of the second prepreg, the first prepreg and the second prepreg may have a viscosity between 4,000 Pa·s and 10,000 Pa·s.

The forming of the second circuit layer may include: forming a first conductive layer on the first surface of the first prepreg; and forming the first conductive layer as the first circuit layer by using a subtractive process, wherein the first conductive layer is formed by stacking the first conductive layer on the first prepreg or plating the first conductive layer in the first prepreg.

The forming of the first circuit layer may include: forming the first circuit layer on the first surface of the first prepreg by using an additive process.

The method may further include: processing a via hole formed on at least one conductive layer including a second conductive layer formed on the first surface of the second prepreg and a third conductive layer formed on the second surface opposite of the first surface of the first prepreg; curing the first prepreg and the second prepreg; and plating an inner surface of the via hole wherein the forming of the second circuit layer includes: stacking and forming the second conductive layer and the second prepreg, wherein the forming of the third circuit layer includes: stacking and forming the third conductive layer and the first prepreg.

The processing of the via hole may include: patterning the at least one conductive layer by using a subtractive process such that the at least one conductive layer corresponds to a via; and forming the via holes by performing resin etching on at least one surface of the circuit board.

The forming of the second and third circuit layer may include: providing a second conductive layer on the first surface of the second prepreg and a third conductive layer on the second surface opposite of the first surface of the first prepreg; and forming the second and third conductive layer as the second and third circuit layer by using the subtractive process, wherein the second conductive layer is formed by stacking the second conductive layer on the second prepreg in the stacking of the second prepreg, and the third conductive layer is formed by stacking the third conductive layer on the first prepreg in the forming of the first circuit layer.

The second or third circuit layer may be formed by using the additive process.

The method may further include: sequentially forming a third prepreg and a fourth circuit layer in a top surface of the circuit layer.

The method may further include: forming a patterned solder resist layer on a first surface of the second circuit layer or a first surface of the third circuit layer.

According to another aspect of an exemplary embodiment, there is provided a method of manufacturing a multi-layer circuit board, the method include: providing a carrier layer including a carrier thin film layer on both sides opposite of each other of a core layer; forming a first prepregs and a first circuit layer on each of the both sides of the core layer; forming a second prepreg and a second conductive layer on a top surface of each of the first circuit layer on the both sides of the core layer; separating a circuit board formed on the each of the both side of the core layer including the carrier thin film layers from the core layer of the carrier layer; and forming a circuit layer on at least one surface of the circuit board, wherein, in the separating of the circuit board, the first prepregs and the second prepregs are semi-cured.

The first prepregs and the second prepregs may include resins having the same viscosity characteristics.

The forming of the second prepreg and the second conductive layer may include: forming the second conductive layer by stacking the second conductive layer and the second prepreg.

The method may further include: forming the second conductive layer as a second circuit layer by using a subtractive process, wherein the forming of the circuit layer comprises: forming each of the carrier thin film layers as a third circuit layer of the circuit board by using the subtractive process.

The method may further include: processing a via hole formed on the at least one surface of the circuit board; curing the first prepregs and the second prepregs; and plating an inside of the via hole.

The processing of the via hole may include: patterning the at least one surface of the circuit board by using a subtractive process such that the at least one surface of the circuit board corresponds to a via; and performing resin etching on the at least one surface of the circuit board.

The circuit layer may be formed by using a subtractive process.

The method may further include: forming the second conductive layer as an inner circuit layer by using a subtractive process; and forming an additional prepreg and an additional circuit layer on a top surface of the inner circuit layer.

The method may further include: forming a patterned solder resist layer on the top surface of the circuit layer.

According to another aspect of an exemplary embodiment, there is provided a multi-layer circuit board including: at least two stacked prepregs; an inner circuit layer impregnated and surrounded by two of the at least two stacked prepregs; and outer circuit layers disposed on a first surface of each of the stacked at least two prepregs opposite from a second surface of each of the stacked at least two prepregs facing the inner layer.

The two prepregs may have a symmetrical structure to each other.

The at least two prepregs surrounding the inner circuit layer may include resins having the same viscosity characteristics.

The multi-layer circuit board may further include: a blind via which plates an inside of a hole formed through one of the at least two prepregs and electrically connects the one or more inner circuit layers and the outer circuit layers.

The multi-layer circuit board may further include: a through hole via which plates an inside of a hole formed through the multi-layer circuit board and electrically connects the outer circuit layers disposed in both sides of the multi-layer circuit board.

BRIEF DESCRIPTION OF THE DRAWINGS

The above and other aspects will become more apparent by describing in detail exemplary embodiments thereof with reference to the attached drawings in which.

DETAILED DESCRIPTION

Figure 1A:
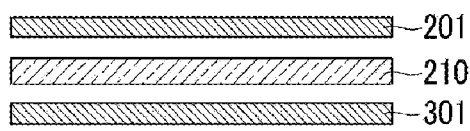
FIGS. 1A through 1J are schematic cross-sectional views illustrating a circuit board to describe a method of manufacturing a multi-layer circuit board, according to an exemplary embodiment.
Figure 1B:
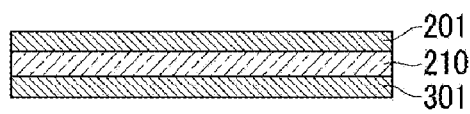
Figure 1C:
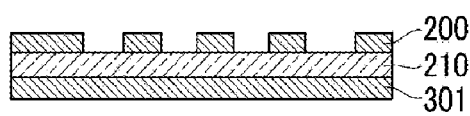

In the following detailed description, only certain exemplary embodiments have been shown and described, simply by way of illustration. As those of ordinary skill in the art would realize, the described exemplary embodiments may be modified in various different ways, all without departing from the spirit or scope of the inventive concept. Accordingly, the drawings and description are to be regarded as illustrative in nature and not restrictive.

Hereinafter, the exemplary embodiments will now be described more fully with reference to the accompanying drawings. Like reference numerals designate like elements throughout the specification.

Figure 3:
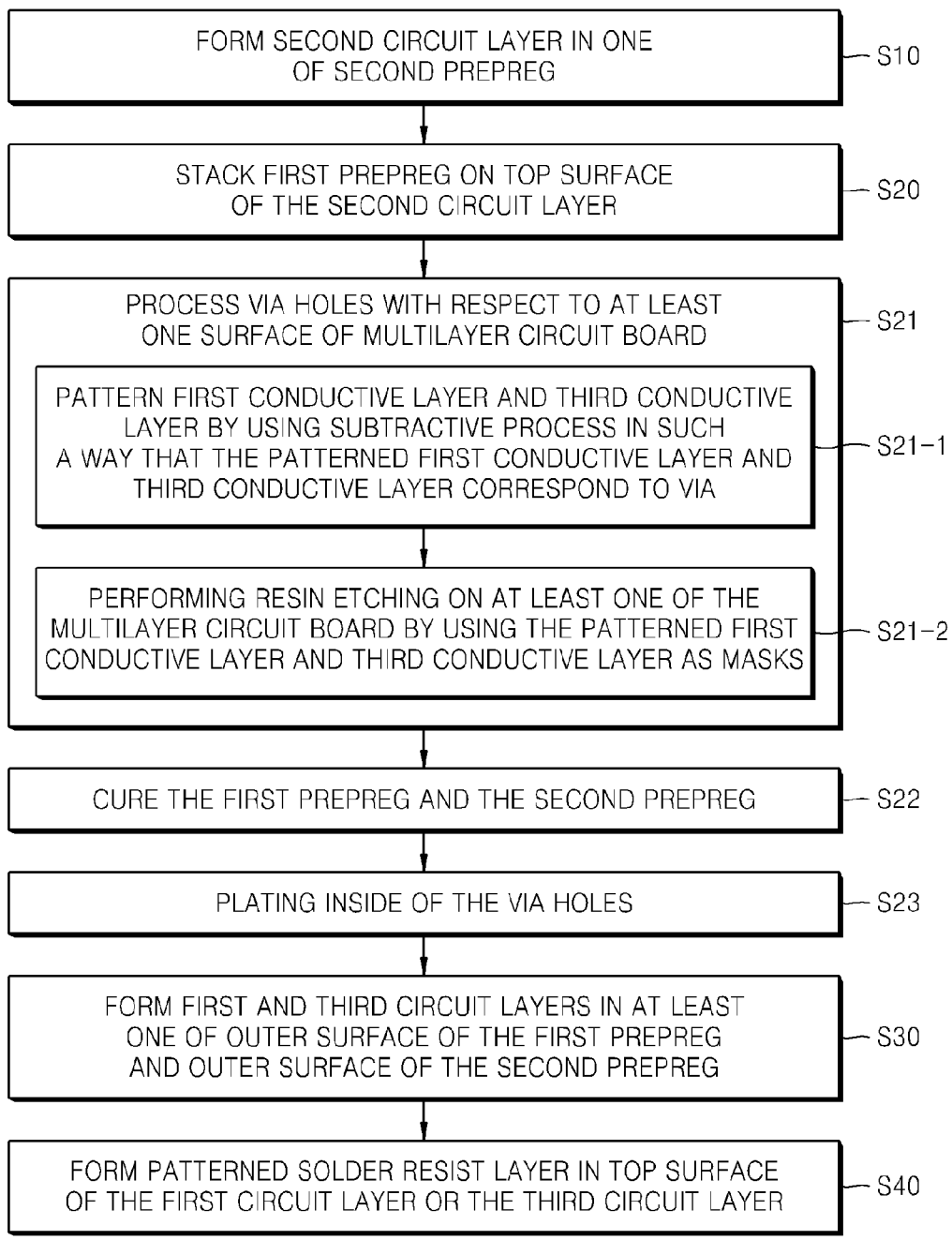
FIG. 3 is a flowchart of the method of manufacturing the multi-layer circuit board of FIG. 1, according to an exemplary embodiment.

FIGS. 1A through 1J are schematic cross-sectional views illustrating a circuit board to describe a method of manufacturing a multi-layer circuit board, according to an exemplary embodiment. FIG. 3 is a flowchart of the method of manufacturing the multi-layer circuit board of FIG. 1, according to an exemplary embodiment.

Referring to FIG. 3, the method of manufacturing the multi-layer circuit board according to the present exemplary embodiment includes operations of forming a second circuit layer 200 on one surface of a second prepreg 210 (S10), stacking a first prepreg 110 on a top surface of the second circuit layer 200 (S20), and forming first and third circuit layers 100 and 300 on at least one of an outer surface of the first prepreg 110 and an outer surface of the second prepreg 210 (S30).

The operations will now be described in detail with reference to FIGS. 1 and 3.

The operation of forming the second circuit layer 200 on one surface of the second prepreg 210 (S10) may include operations of forming a second conductive layer 201 on one surface of the second prepreg 210 and forming the second conductive layer 201 as the second circuit layer 200 by using a subtractive process. In operation S10, the second circuit layer 200 may be formed on one surface of the second prepreg 210 by using an additive process.

The subtractive process is a process of forming a conductor pattern by selectively removing an unnecessary part of a conductive layer by etching. Examples of the subtractive process include a tenting process and a panel/pattern process.

The tenting process sequentially performs a planting layer by electroless plating and electroplating, coats a photosensitive resist on the planting layer, performs exposure and developing on the photosensitive resist, and forms a pattern. Thereafter, a circuit is formed by etching the planting layer by using the patterned photosensitive resist as a mask and stripping the photosensitive resist.

The panel/pattern process sequentially performs a planting layer by electroless plating and electroplating, coats a photosensitive resist on the planting layer, performs exposure and developing on the photosensitive resist, and forms a pattern. Thereafter, a circuit is formed by performing electroplating, obtaining patterned plating, and stripping and etching the photosensitive resist.

The additive process is a process of forming a conductor pattern on an insulator layer by selectively extracting a conductive material through plating. Examples of the additive process include a semi-additive process (SAP), a modified semi-additive process (MSAP), an advanced modified semi-additive process (AMSAP), a full-additive process (FAP), and the like.

The SAP, the MSAP, and the AMSAP which are all similar to one another, sequentially perform electroless plating, coat photosensitive resists on the planting layer, perform exposure and developing on the photosensitive resists, and form patterns. Thereafter, circuits are formed by performing electroplating, obtaining patterned plating, and stripping and etching the photosensitive resists.

The FAP forms a pattern by coating a photosensitive resist on a substrate and performing exposure and developing on the photosensitive resist, and forms a circuit by performing electroless plating on the patterned photosensitive resist.

The second circuit layer 200 may be formed by using various processes other than the subtractive process or the additive process. However, in a case where the subtractive process is used to form the second circuit layer 200, in advance the second conductive layer 201 is formed by stacking a thin film layer formed of a conductive material such as a copper foil layer or by performing electroless plating and/or electroplating. The stacking of the thin film layer is performed in order to perform selective etching in such a way that the second conductive layer 201 may correspond to conductor patterns of the second circuit layer 200.

Likewise, a third conductive layer 301 is formed in order to form the third circuit layer 300 by using the subtractive process. Thus, as shown in FIG. 1(a), the second conductive layer 201 and the third conductive layer 301 may be simultaneously stacked on both sides of the second prepreg 210 (see FIGS. 1A and 1B).

In this regard, when the second conductive layer 201 and/or the third conductive layer 301 are stacked on both sides of the second prepreg 210, the second prepreg 210 may not be fully cured into polymers by heat, pressure, etc. but may remain semi-cured. In this semi-cured state, the viscosity of the second prepreg 210 may be in a range between 4,000 Pa·s and 10,000 Pa·s.

With respect to the second prepreg 210, epoxy resin, polyimide resin, BT (BismaleimideTriazine) resin, or Teflon resin, etc. is impregnated into a reinforcing material such as paper, glass fiber, glass felt, etc. in order to increase mechanical rigidity or temperature resistivity. In the case of a prepreg having an FR-4 grade based on the National Electrical Manufacturers Association (NEMA) specification, in which epoxy resin is impregnated into glass fiber used to manufacture a circuit board, the second conductive layer 201 and/or the third conductive layer 301 may be stacked in the second prepreg 210 at a temperature of between about 140° C. and about 180° C. for about 20 minutes to meet the above viscosity range.

Figure 1D:
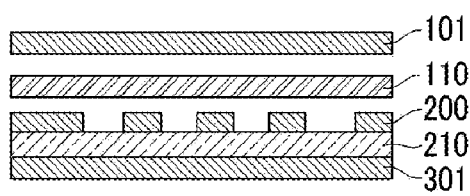

Next, after forming the second circuit layer 200 by using the subtractive process or the additive process (see FIG. 1C), the first prepreg 110 is stacked on a top surface of the second circuit layer 200 (S20) (see FIG. 1D).

In this regard, similar to the second prepreg 210, the first prepreg 110 is maintained in a semi-cured state before being fully cured. In a case where the first prepreg 110 is stacked on the top surface of the second circuit layer 200, in the same way as the second conductive layer 201 and/or the third conductive layer 301 may be stacked in the second prepreg 210, the first prepreg 110 may be stacked on the top surface of the second circuit layer 200 at the viscosity between 4,000 Pa·s and 10,000 Pa·s. Similar to the second prepreg 210, the first prepreg 110 having an FR-4 grade (the NEMA specification) in which epoxy resin is impregnated into glass fiber, the first prepreg 110 may be stacked on the top surface of the second circuit layer 200 at a temperature between about 140° C. and about 180° C. for about 20 minutes to meet the above viscosity range.

Figure 1E:
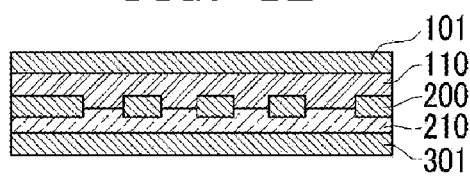
Figure 1F:
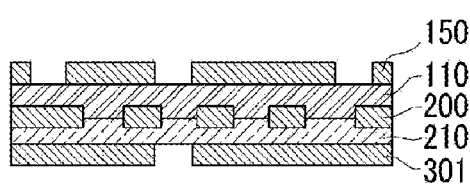

In a case where both the first prepreg 110 and the second prepreg 210 that are maintained in a semi-cured state before being fully cured, polymers are stacked by using the first prepreg 110, and the second prepreg 210 having the same characteristics, the second circuit layer 200 is sunken and disposed between the first prepreg 110 and the second prepreg 210 so that the first prepreg 110 and the second prepreg 210 are symmetrically stacked with respect to the conductor patterns protruding from the second circuit layer 200 (see FIG. 1E).

Figure 2:
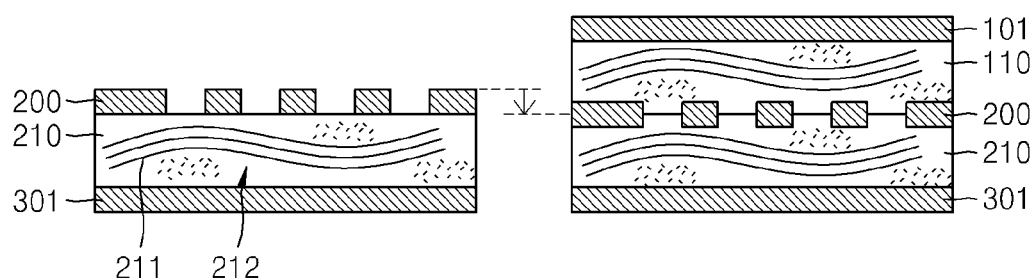
FIG. 2 is a schematic cross-sectional view illustrating two prepregs having a symmetrical structure in connection with FIGS. 1D and 1(e)

FIG. 2 is a schematic cross-sectional view illustrating the first prepreg 110 and the second prepreg 210 having a symmetrical structure in connection with FIGS. 1D and 1E.

Referring to FIG. 2, in a case where the first prepreg 110 in a semi-cured state is stacked on a top surface of the second circuit layer 200 formed on a top surface of the second prepreg 210 in a semi-cured state, a mechanism used to allow the first prepreg 110 and the second prepreg 210 to have the same thickness will now be described. In this regard, the first prepreg 110 and the second prepreg 210 are exemplary prepregs having the same characteristics as the FR-4 grade (the NEMA specification) in which epoxy resin 212 is impregnated into glass fiber 211.

The epoxy resin 212 included in the first prepreg 110 and the second prepreg 210 in the semi-cured state have a viscosity range between 4,000 Pa·s and 10,000 Pa·s at a temperature between about 140° C. and about 180° C., so that a flow occurs, and thus the epoxy resin 212 flows between patterns of the second circuit layer 200. In this regard, the glass fiber 211 of the first prepreg 110 and the second prepreg 210 has rigidity characteristics and acts as a supporter for maintaining thicknesses of the first prepreg 110 and the second prepreg 210.

In a case where the first prepreg 110 and the second prepreg 210 having the same viscosity characteristics in the semi-cured state are stacked on top and bottom surfaces of the second circuit layer 200, since the same glass fiber 211 is included in the first prepreg 110 and the second prepreg 210, the first prepreg 110 and the second prepreg 210 maintain the same thickness, a lower pattern of the second circuit layer 200 is pressed and comes into the epoxy resin 212 of the second prepreg 210, and an upper pattern of the second circuit layer 200 is pressed and comes into the epoxy resin 212 of the first prepreg 110. Thus, as shown in FIG. 1(e), the first prepreg 110 and the second prepreg 210 have the symmetrical structure in which the first prepreg 110 and the second prepreg 210 have the same thickness with the second circuit layer 200 therebetween.

In this way, the first prepreg 110 and the second prepreg 210 are symmetrically stacked with respect to the second circuit layer 200, thereby solving a problem of warpage of the circuit board. Prepregs having different characteristics are stacked as in the related art in order to prevent the circuit board from warping.

Thereafter, a circuit layer is formed on an outer surface of the first prepreg 110 and/or an outer surface of the second prepreg 210 (S30), and thus a multi-layer circuit board is manufactured (see FIG. 1(*i*)).

The first and third circuit layers 100 and 300 formed on an outer surface of the multi-layer circuit board may be formed by using the subtractive process or the additive process. Before forming the first and third circuit layers 100 and 300 on the outer surface of the multi-layer circuit board, the method of forming the multi-layer circuit board according to the present exemplary embodiment may further include an operation of forming vias that connect the conductive layers to each other.

That is, after stacking the first prepreg 110 on the top surface of the second circuit layer 200 (S20), the method may further include operations of processing the via holes with respect to at least one of a first conductive layer 101 formed on the outer surface of the first prepreg 110 and a third conductive layer 301 formed on the outer surface of the second prepreg 210 (S21), curing the first prepreg 110 and the second prepreg 210 (S22), and plating the inside of the via holes (S23). Meanwhile, the present exemplary embodiment is not limited thereto. After the first prepreg 110 is stacked on a top surface of the second circuit layer 200, the first prepreg 110 and the second prepreg 210 may be simultaneously cured and then the via holes may be processed.

In the operation of processing the via holes with respect to at least one of the first conductive layer 101 formed on the outer surface of the first prepreg 110 and the third conductive layer 301 formed on the outer surface of the second prepreg 210 (S21), the first conductive layer 101 and/or the third conductive layer 301 may be formed by stacking a thin film layer formed of a conductive material or by performing electroless plating and/or electroplating in the same way as the second conductive layer 201 is formed. In a case where the thin film layer is stacked to form the first conductive layer 101 and/or the third conductive layer 301, the first conductive layer 101 and the first prepreg 110 may be stacked on the top surface of the second circuit layer 200, and the third conductive layer 301 and the second prepreg 210 may be stacked on the bottom surface of the second circuit layer 200.

That is, as shown in FIG. 1D, the first conductive layer 101 is formed by stacking the first conductive layer 101 and the first prepreg 110 on the second circuit layer 200, and as shown in FIG. 1A, the third conductive layer 301 is formed by stacking the second conductive layer 201 and the third conductive layer 301 on both sides of the second prepreg 210.

Figure 1G:
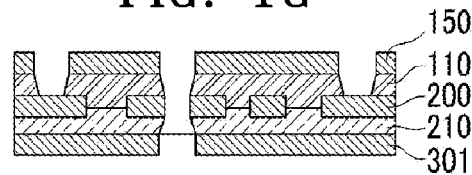

Thereafter, as shown in FIG. 1G, the via holes may be processed with respect to at least one surface of the multi-layer circuit board, i.e. at least one of the first conductive layer 101 and the third conductive layer 301 (S21).

The via holes may be processed by drilling in a mechanical way, by using UV or $CO_2$ laser, or by resin etching.

In a case where the via holes are processed by resin etching, the operation of processing the via holes (S21) may include operations of patterning the first conductive layer 101 and the third conductive layer 301 by using the subtractive process in such a way that the patterned first conductive layer 101 and third conductive layer 301 correspond to a via (S21-1) (see FIG. 1F) and performing resin etching on at least one of the first prepreg 110 and the second prepreg 210 by using the patterned first conductive layer 101 and third conductive layer 301 as masks 150 and 350 (S21-2) (see FIG. 1G).

However, in a case where the via holes are processed in a mechanical way or by using laser, it takes more time than that taken in processing the via holes by using resin etching, which deteriorates productivity, and may need a desmear process to remove smear that occurs due to friction heat generated in inner walls of the via holes, and thus the via holes may be processed by resin etching.

In this regard, although the operation of performing resin etching (S21-2) may be performed after the first prepreg 110 and the second prepreg 210 are being polyer and cured, the cured first prepreg 110 and second prepreg 210 have strong chemical resistance to an etchant that performs resin etching, and thus the operation S21-2 may be performed before the first prepreg 110 and the second prepreg 210 are fully cured.

Resin etching may be performed to process the via holes by using a conductive layer patterned on only one of the first prepreg 110 and the second prepreg 210 as the masks 150 and 350. However, as shown in FIG. 1G, resin etching may be performed on both the first prepreg 110 and the second prepreg 210, i.e. both sides of the circuit board. In this case, the second circuit layer 200 is used to prevent a drilling process performed on the circuit board by resin etching, and thus through holes and blind via holes may be simultaneously processed by using the same method.

After processing the via hole, the first prepreg 110 and the second prepreg 210 are fully cured (S22), and vias are formed by plating the inside of the via holes (S23).

The first prepreg 110 and the second prepreg 210 are fully cured to be polymers by heating a material through a process such as a post-cure process.

Figure 1H:
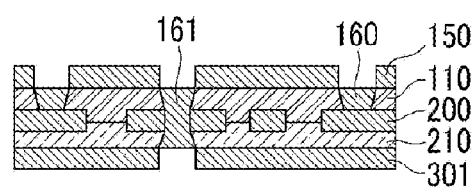
Figure 1I:
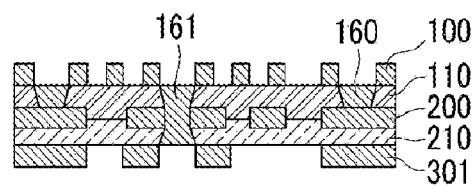

At least two of the first circuit layer 100, the second circuit layer 200, and the third circuit layer 300 are electrically connected to each other by performing electroless plating and/or electroplating on the inside of the via holes formed on the cured first prepreg 110 and second prepreg 210 (see FIG. 1H).

Thereafter, a circuit layer is formed as the first circuit layer 100 and/or the third circuit layer on the outermost layer of a three-layer circuit board, i.e. at least one of the outer surface of the first prepreg 110 and the outer surface of the second prepreg 210, and thus the multi-layer circuit board is manufactured (see FIG. 1(*i*)).

The first circuit layer 100 or the third circuit layer 300 may be formed by forming the first conductive layer 101 and the third conductive layer 301 by using the subtractive process or the additive process.

In this regard, the method of forming the first circuit layer 100 or the third circuit layer 300 by using the subtractive process may include operations of forming at least one of the first conductive layer 101 on the outer surface of the first prepreg 110 and the third conductive layer 301 on the outer surface of the second prepreg 210 and forming the first conductive layer 101 and the third conductive layer 301 as the first circuit layer 100 and the third circuit layer 300 by using the subtractive process.

Since the patterned first conductive layer 101 and third conductive layer 301 are formed after forming the via, a conductive layer may not be formed and the first circuit layer 100 and the third circuit layer 300 may be formed corresponding to the circuit patterns by selective etching.

Thereafter, a patterned solder resist layer 800 may be formed on at least one surface of the multi-layer circuit board, i.e. the top surface of the first circuit layer 100 or the third circuit layer 300 (S40) (see FIG. 1J) in order to protect the first circuit layer 100 and the third circuit layer 300 and prevent an unnecessary part of the circuit layer from being soldered.

The patterned solder resist layer 800 may be formed by using a screen printing process of coating solder resist ink onto a necessary part of the surface of the multi-layer circuit board using a screen engraving plate or, by using a photo process of coating the solder resist ink on the entire surface of the surface of the multi-layer circuit board, performing exposure and developing on the coated solder resist, and coating the solder resist ink on a necessary part thereof.

After forming the patterned solder resist layer 800 on at least one surface of the multi-layer circuit board, surface treatment processes such as solder coating, free-flux, chemical anticorrosive processing, electroless nickel plating, gold plating, solder plating, and the like may be performed.

FIGS. 4A through 4L are schematic cross-sectional views illustrating a circuit board to describe a method of manufacturing a multi-layer circuit board with improved productivity, according to an exemplary embodiment. FIG. 5 is a flowchart of the method of manufacturing the multi-layer circuit board of FIGS. 4A through 4L, according to an exemplary embodiment.

As shown in FIG. 5, the method of manufacturing the multi-layer circuit board with improved productivity according to the present exemplary embodiment includes operations of preparing a carrier layer 500 including carrier thin film layers 400 on both sides of a core layer 420 (S100), sequentially forming the second prepregs 210 and the second circuit layers 200 on both sides of the carrier layer 500 (S200), forming the first prepregs 110 and the first conductive layers 101 on top surfaces of the second circuit layers 200 (S300), separating first and second circuit boards 600 and 700 including the carrier thin film layers 400 from the core layer 420 of the carrier layer 500 (S400), and forming the first and third circuit layers 100 and 300 on at least one surface of the first and second circuit boards 600 and 700 (S500).

Each operation will now be described in detail with reference to FIGS. 4A through 4L, and redundant descriptions between the previous exemplary embodiment and the present exemplary embodiment will be omitted.

The carrier layer 500 including the carrier thin film layers 400 formed of a conductive material on both sides of a core layer 420 is prepared (S100).

Figure 4A:
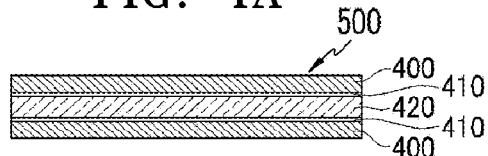
FIGS. 4A through 4L are schematic cross-sectional views illustrating a circuit board to describe a method of manufacturing a multi-layer circuit board with improved productivity, according to an exemplary embodiment.
Figure 4B:
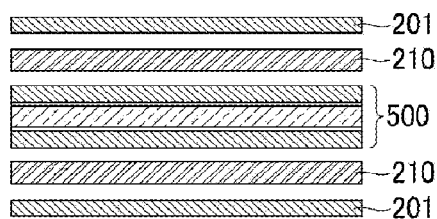
Figure 4C:
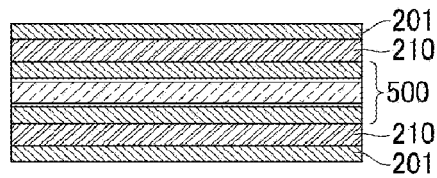
Figure 4D:
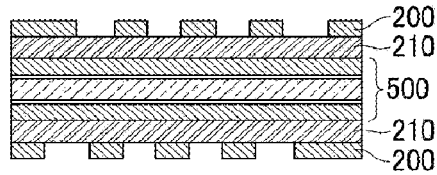
Figure 4E:
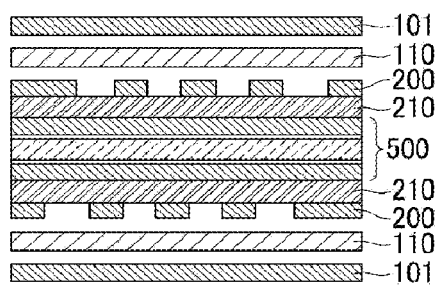
Figure 5:
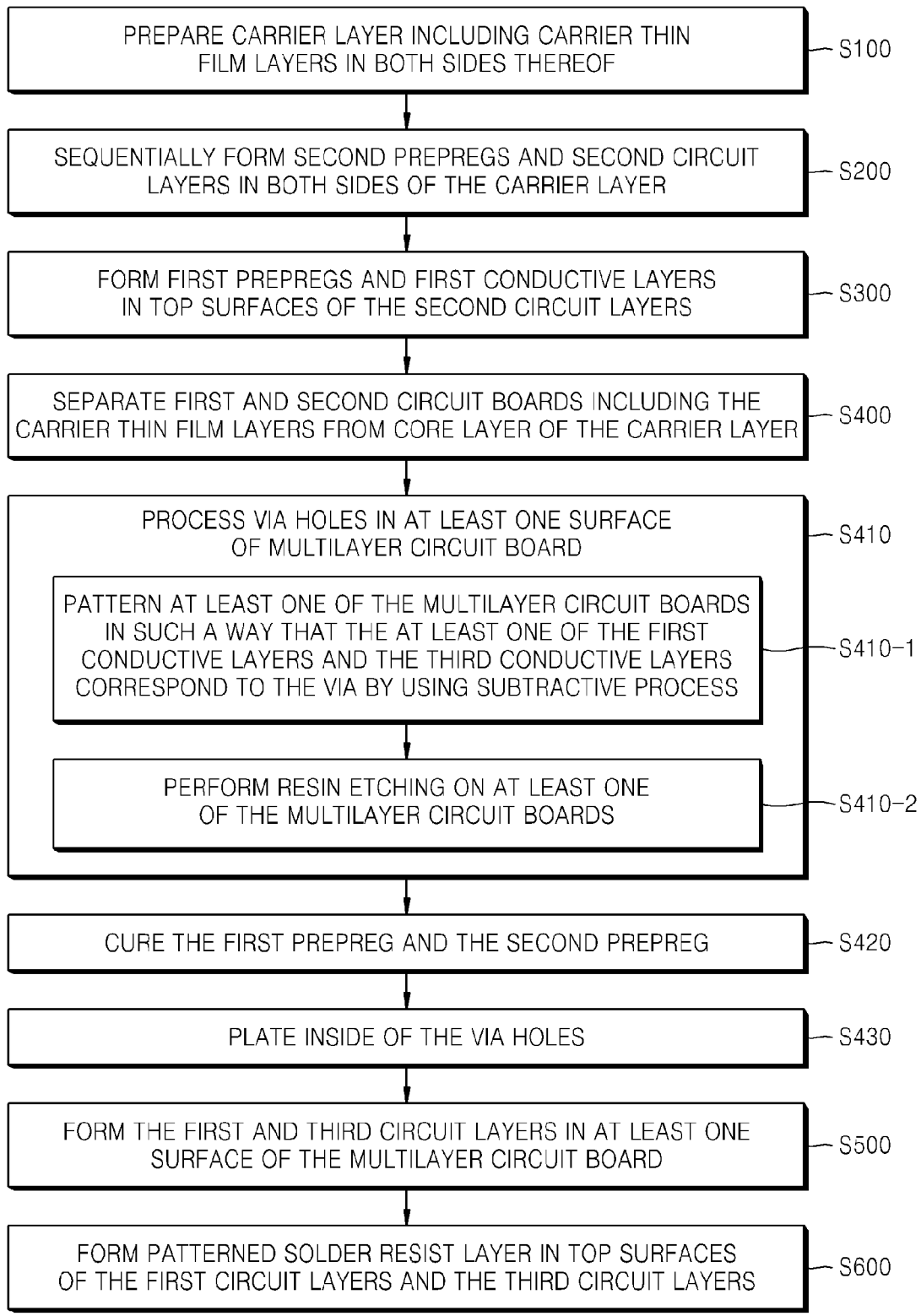
FIG. 5 is a flowchart of the method of manufacturing the multi-layer circuit board of FIG. 3, according to an exemplary embodiment.
Figure 6A:
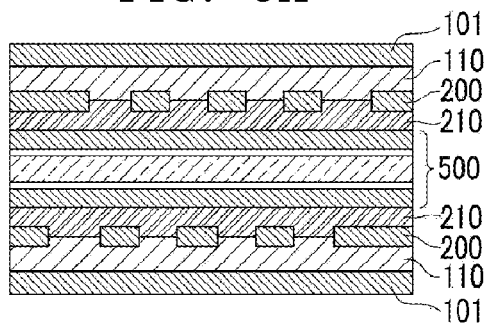
FIGS. 6A through 6E are schematic cross-sectional views illustrating a circuit board to describe a method of manufacturing a multi-layer circuit board having four or more layers, according to an exemplary embodiment.
Figure 6D:
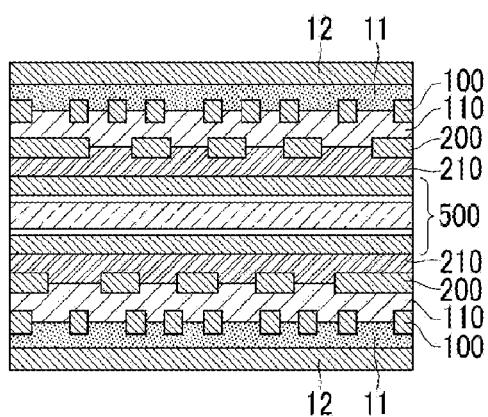
Figure 6B:
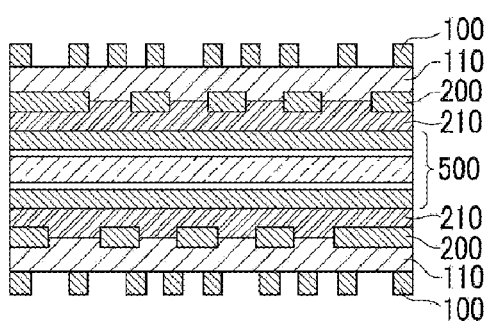
Figure 6E:
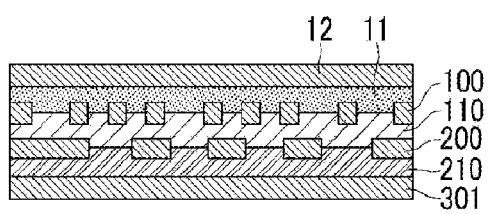
Figure 6C:
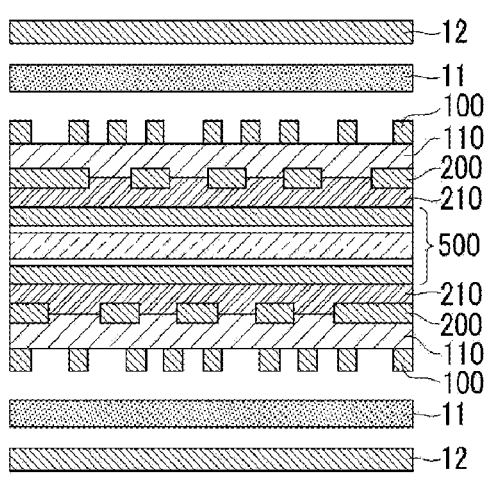
Figure 6C:
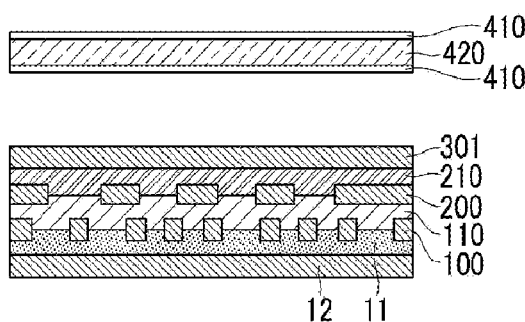

Although the carrier layer 500 may be a copper clad laminate (CCL) including the carrier thin film layers 400 formed of a conductive material on both sides of the core layer 420, as shown in FIG. 4A, the carrier layer 500 may include adhesive layers 410 between the carrier thin film layers 400 and the core layer 420 so that the carrier thin film layers 400 may be separated from the core layer 420.

In this regard, the core layer 420 may be formed by impregnating epoxy resin, polyimide resin, BT resin, or Teflon resin, etc. into a reinforcing material such as paper, glass fiber, glass felt, etc. in order to increase mechanical rigidity or temperature resistivity.

The adhesive layers 410 are formed on both sides of the core layer 420. Thin film layers as the carrier thin film layers 400 formed of a conductive material are attached to outer surfaces of the adhesive layers 410, and thus two substrates may be manufactured through one process. In this regard, the adhesive layers 410 may include materials that lose adhesive force due to thermal processing and be released after a predetermined process.

Furthermore, the carrier thin film layers 400 attached to outer surfaces of the adhesive layers 410 may have predetermined thicknesses of conductive materials. The thicknesses may be between 15-20 μm, but preferably about 18 μm. In a case where fine circuit patterns are formed, the thicknesses may be between 1-5 μm, but preferably about 3 μm.

After preparing the carrier layer 500 including the adhesive layers 410 and the carrier thin film layers 400 with respect to the core layer 420 (S100), the second prepregs 210 and the second circuit layers 200 are sequentially formed on both sides of the carrier layer 500 (S200).

As described in the previous exemplary embodiment, the second circuit layers 200 may be formed on outer surfaces of the second prepregs 210 by using a subtractive process or an additive process.

To form the second circuit layers 200 by using the subtractive process, the second conductive layers 201 are firstly formed, and thus the second conductive layers 201 may be formed by stacking the second prepregs 210 and the second conductive layers 201 on both sides of the carrier layer 500 (see FIGS. 4B and 4C) or firstly stacking the second prepregs 210 on both sides of the carrier layer 500 and performing electroless plating and/or electroplating on outer surfaces of the second prepregs 210.

In this regard, in a case where the second prepregs 210 are stacked, since the stacked second prepregs 210 need to be semi-cured, as described in the previous exemplary embodiment, the second prepregs 210 may be stacked at a viscosity between 4,000 Pa·s and 10,000 Pa·s (in the case of prepregs having an FR-4 grade (the NEMA specification) in which epoxy resin is impregnated into glass fiber, the second prepregs 210 may be stacked at a temperature between 140° C. and 180° C. for about 20 minutes to meet the above viscosity range).

Thereafter, an unnecessary part of the second conductive layers 201 is selectively removed by etching of a second circuit pattern, and thus the second circuit layers 200 may be formed.

To form the first circuit layers 100 on the second circuit layers 200, the first prepregs 110 and the first conductive layers 101 are formed on top surfaces of the first and second circuit boards 600 and 700 in which the second circuit layers 200 are formed, i.e. surfaces onto which the carrier layer 500 is not attached (S300).

Likewise the second prepregs 210 and the second conductive layers 201, the first conductive layers 101 may be formed by stacking the first prepregs 110 and the first conductive layers 101 on top surfaces of the second circuit layers 200 (see FIG. 3E) or firstly stacking the first prepregs 110 on top surfaces of the second circuit layers 200 and performing electroless plating and/or electroplating on outer surfaces of the first prepregs 110.

In a case where the first prepregs 110 are stacked, since the first prepregs 110 and the second prepregs 210 need to be semi-cured, the first prepregs 110 may be also stacked at a viscosity between 4,000 Pa·s and 10,000 Pa·s (in the case of prepregs having an FR-4 level (the NMA specification) in which epoxy resin is impregnated into glass fiber, the second prepregs 210 may be stacked at a temperature between 140° C. and 180° C. for about 20 minutes to meet the above viscosity range).

In this regard, the first prepregs 110 may prevent the circuit board from warping by using even prepregs having the same characteristics as those of the second prepregs 210 as opposed to using prepregs having different characteristics as in the related art.

In a case where the first prepregs 110 and the second prepregs 210 are stacked under the above-described conditions, the first prepregs 110 and the second prepregs 210 are maintained semi-cured, and the second circuit layers 200 is sunken and disposed between the first prepregs 110 and the second prepregs 210 so that the first prepregs 110 and the second prepregs 210 are symmetrically stacked with respect to conductor patterns protruding from the second circuit layers 200 (see FIG. 4F), thereby preventing the circuit board from warping.

Figure 4F:
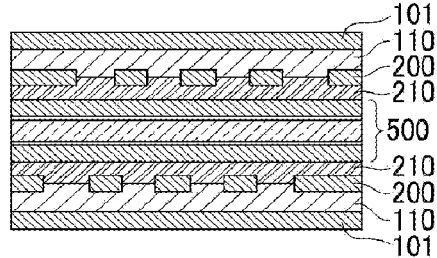

In a case where the first prepreg 110 and the second prepreg 210 having the same characteristics in the semi-cured state are stacked on top and bottom surfaces of the second circuit layer 200, since the same glass fiber is included in the first prepreg 110 and the second prepreg 210, the first prepreg 110 and the second prepreg 210 maintain the same thickness, epoxy resin of the first prepreg 110 and the second prepreg 210 are pressed and come between patterns of the second circuit layer 200. Thus, as shown in FIG. 4F, the first prepreg 110 and the second prepreg 210 have a symmetrical structure in which the first prepreg 110 and the second prepreg 210 have the same thickness with the second circuit layer 200 therebetween.

Thereafter, the first and second circuit boards 600 and 700 including the carrier thin film layers 400 are separated from the core layer 420 of the carrier layer 500 (S400).

Figure 4G:
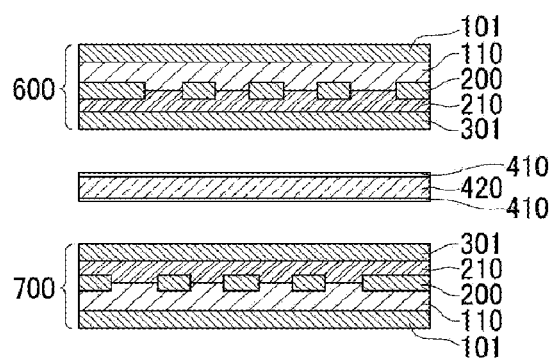
Figure 4H:
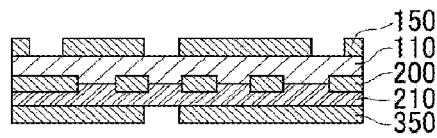
Figure 4I:
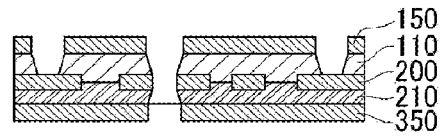

The adhesive layers 410 are processed in accordance with characteristics thereof (for example, thermal processing for heating the adhesive layers 410 to a predetermined temperature) in such a way that adhesive forces of the adhesive layers 410 formed on the carrier layer 500 are reduced, and thus adhesive forces are reduced, and the first and second circuit boards 600 and 700 including the carrier thin film layers 400 and the second prepregs 210 and the second circuit layers 200 stacked on the carrier thin film layers 400 are separated from the core layer 420 (see FIG. 4G). These two separated circuit boards are referred to as the first and second circuit boards 600 and 700 in the exemplary present embodiment.

From this time, the carrier thin film layers 400 included in the first and second circuit boards 600 and 700 function as the third conductive layers 301 that are bases for forming the third circuit layers 300 by using the subtractive process. The carrier thin film layers 400 separated from the core layer 420 are regarded as being the same as the third conductive layers 301 below.

Thereafter, to form a via on at least one surface of the separated first and second circuit boards 600 and 700, i.e. at least one of the first conductive layers 101 and the third conductive layers 301, the method of manufacturing the multi-layer circuit board according to the present exemplary embodiment may further include an operation of processing via holes on the at least one surface of the separated first and second circuit boards 600 and 700 (S410).

In a case where via holes are processed, although via holes can be processed by using laser, as described above, via holes may be processed by resin etching. In this case, the operation of processing via holes (S410) may include operations of patterning at least one of the first conductive layers 101 and the third conductive layers 310 in such a way that the at least one of the first conductive layers 101 and the third conductive layers 310 may correspond to the via by using the subtractive process (S410-1) (see FIG. 4H), and performing resin etching on at least one of the first prepregs 110 and the second prepregs 210 by using the patterned first conductive layers 101 and third conductive layers 301 as the masks 150 and 350 (S410-2) (see FIG. 4L).

The operations S410-1 and S410-2 are the same as described in the corresponding operations in the previous exemplary embodiment. Resin etching is simultaneously performed on both the first prepregs 110 and the second prepregs 210, i.e., both sides of the circuit board, by using the patterned first conductive layers 101 and third conductive layers 301 as the masks 150 and 350, thereby forming through holes or blind via holes faster than processing via holes by using laser, and simultaneously forming through holes or blind via holes.

Figure 4J:
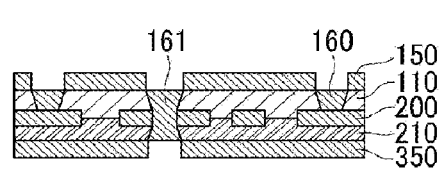
Figure 4K:
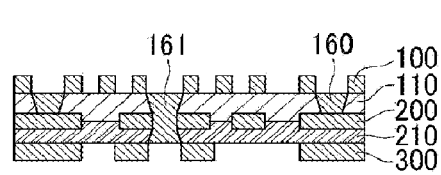

After processing the via holes (S410), the method of manufacturing the multi-layer circuit board according to the present exemplary embodiment may further include operations of fully curing the first prepregs 110 and the second prepregs 210 (S420) and plating the inside of the via holes (S430) (see FIG. 4J). Meanwhile, the present exemplary embodiment is not limited thereto. After the first prepreg 110 is stacked on a top surface of the second circuit layer 200, and the first and second circuit boards 600 and 700 are separated from the core layer 420, the first prepreg 110 and the second prepreg 210 may be simultaneously cured and then the via holes may be processed.

As described in the previous exemplary embodiment, the first prepregs 110 and the second prepregs 210 are cured and made to be polymers through a post-cure process, and then, at least two layers of the multi-layer circuit board are electrically connected by plating the inside of the via holes.

After separating the first and second circuit boards 600 and 700 from the core layer 420 of the carrier layer 500 (S400), the first circuit layers 100 or the third circuit layers 300 are formed on at least one surface of the first and second circuit boards 600 and 700 (S500), thereby forming a three-layer circuit board.

In this regard, although the first circuit layers 100 may be formed on at least one surface of the separated first and second circuit boards 600 and 700, the first conductive layers 101 may be formed as the first circuit layers 100 by using the subtractive process before the first and second circuit boards 600 and 700 are separated from the carrier layer 500. After the first and second circuit boards 600 and 700 are separated from the carrier layer 500, the operation of forming the first circuit layers 100 or the third circuit layers 300 (S500) may form the carrier thin film layers 400, i.e. the third conductive layers 301, as the third circuit layers 300 by using the subtractive process.

In this case, the first circuit layers 100 may be simultaneously formed on the two first and second circuit boards 600 and 700. In this regard, after separating the first and second circuit boards 600 and 700 from the core layer 420, resist layers may be formed on entire surfaces of the first circuit layers 100 in order to protect the first circuit layers 100 from an etchant during the process of forming the third circuit layers 300 by using the subtractive process.

Thereafter, to protect the first circuit layers 100 or the third circuit layers 300, and prevent an unnecessary part of the circuit board from being soldered, the patterned solder resist layer 800 may be formed on top surfaces of the first circuit layers 100 and the third circuit layers 300 (S600). Finally, the method of manufacturing the multi-layer circuit board according to the present exemplary embodiment may further include a surface treatment process.

As described above, unlike the method of manufacturing the multi-layer circuit board described in the previous exemplary embodiment, the method of manufacturing the multi-layer circuit board according to the present exemplary embodiment can manufacture two boards with respect to a carrier layer through FIGS. 4A through 4F process within one process, thereby improving productivity.

FIGS. 6A through 6E are schematic cross-sectional views illustrating a circuit board to describe a method of manufacturing a multi-layer circuit board having four or more layers, according to an exemplary embodiment.

Although the method of manufacturing the multi-layer circuit board having four or more layers may be applied to a method of related art such as a lay-up method or a build-up method or use an application thereof, the method of manufacturing the multi-layer circuit board having four or more layers according to the present exemplary embodiment sequentially forms additional prepregs that are semi-cured to prevent the multi-layer circuit board from warping and a method of manufacturing additional circuit layers.

As in the previous exemplary embodiment described with reference to FIGS. 1 and 3, the multi-layer circuit board having four or more layers may be manufactured by forming the first and third circuit layers 100 and 300 on at least one of an outer surface of the first prepreg 110 and an outer surface of the second prepreg 210 (S30) and sequentially forming additional fourth and fifth prepregs and an additional circuit layer on the top surfaces of the first and third circuit layers 100 and 300 that are formed before the fourth and fifth prepregs are fully cured to be polymers.

As in the previous exemplary embodiment described with reference to FIGS. 4 and 5, the multi-layer circuit board having four or more layers may be manufactured by forming the first prepregs 110 and the first conductive layers 101 on the top surfaces of the second circuit layers 200 (S300) (see FIG. 6A), forming the first conductive layers 101 as inner circuit layers by using a subtractive process (see FIG. 6B), forming other prepregs 11 and other conductive layers 12 on top surfaces of the inner circuit layers, before prepregs 11 are fully cured to be polymers (see FIGS. 6C and 6D), separating a circuit board from the adhesive layers 410 of the carrier layer 500, and forming a circuit layer on at least one surface of the circuit board by using the subtractive process. The multi-layer circuit board having four or more layers may be manufactured by repeatedly performing operations.

In this regard, in a case where two prepregs are stacked in order to form the prepregs 11 and the conductive layers 12 on the top surfaces of the inner circuit layers, as described in the previous exemplary embodiments, two prepregs may be stacked at a viscosity between 4,000 Pa·s and 10,000 Pa·s (in the case of a prepreg having an FR-4 grade (the NEMA specification) in which epoxy resin is impregnated into glass fiber, two prepregs may be stacked at a temperature between 140° C. and 180° C. for about 20 minutes to meet the above viscosity range) so that conductor patterns of circuit layers formed on an outer surface of the circuit board naturally move between two prepregs and thus two prepregs may be symmetrical to each other.

The multi-layer circuit board having four or more layers that prevents a circuit board from warping may be manufactured by using semi-cured prepregs even though prepregs having the same characteristics as those of the semi-cured prepregs are used without using prepregs having different characteristics from those of the semi-cured prepregs.

The multi-layer circuit board will now be described with reference to FIGS. 1J and 4L.

Figure 1J:
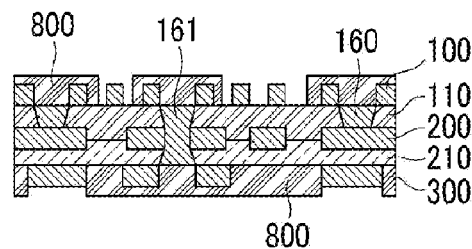
Figure 4L:
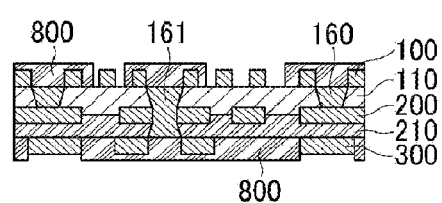

FIGS. 1J and 4L are cross-sectional views of the multi-layer circuit board manufactured by using the above-described method of manufacturing the multi-layer circuit board.

As shown in FIGS. 1J and 4L, the multi-layer circuit board includes the second circuit layers 200 disposed between the first prepregs 110 and the second prepregs 210 and impregnated and surrounded by the first prepregs 110 and the second prepregs 210, the first circuit layers 100 formed on outer surfaces of the first prepreg 110, and the third circuit layers 300 formed on outer surfaces of the second prepregs 210.

Hereinafter, a circuit layer having a circuit pattern such as the first circuit layers 100 or the third circuit layers 300 and exposed to an outer surface of the multi-layer circuit board is referred to as an outer circuit layer, and a circuit layer corresponding to the outer circuit layer, having a circuit pattern such as the second circuit layers 200, formed inside the multi-layer circuit board, and not exposed to the outside is referred to as an inner circuit layer.

Therefore, the multi-layer circuit board according to the exemplary embodiment includes the stacked two or more prepregs 110 and 210, the one or more inner circuit layers 200 impregnated and surrounded by the two prepregs 110 and 210, and the outer circuit layers 100 and 300 exposed to the outside and formed on at least one surface of the circuit board.

In the multi-layer circuit board according to the exemplary embodiment, the inner circuit layer is impregnated and surrounded by two prepregs disposed on top and bottom surfaces of the inner circuit layer, and the two prepregs disposed on top and bottom surfaces of the inner circuit layers 200 are symmetrical to each other with respect to a conductor pattern protruding from the inner circuit layer.

That is, as shown in FIGS. 1J and 4L, the second circuit layers 200 are impregnated and surrounded by the first and second prepregs 110 and 210, and the first and second prepregs 110 and 210 are symmetrical to each other with respect to a conductor pattern protruding from the second circuit layers 200

As described above, the two prepregs 110 and 210 disposed on top and bottom surfaces of the inner circuit layer do not have stack layers having different characteristics as in the related art to prevent a warpage of a circuit board but have stack layers having the same characteristic, and thus the conductor pattern protruding from the inner circuit layer naturally moves to the center of the semi-cured prepregs 110 and 210, thereby preventing the circuit board from warping.

The multi-layer circuit board according to the exemplary embodiment may further include at least one blind via that is plated inside a hole formed through at least one of the two prepregs and electrically connects the inner circuit layer and the outer circuit layer, and at least one through hole via 161 that is plated inside a hole formed through the multi-layer circuit board and electrically connects the outer circuit layers formed on both sides of the multi-layer circuit board.

That is, as shown in FIGS. 1J and 4L, the multi-layer circuit board according to the exemplary embodiment may further include blind vias 160 that are plated inside holes formed through the first prepregs 110 and electrically connects the first circuit layers 100 and the second circuit layers 200, i.e. the inner circuit layers and the outer circuit layers, and a via such as a through hole via 161 that is plated inside a hole formed through the first pregpregs 110 and the second prepregs 210, i.e. the multi-layer circuit board, and electrically connects the first circuit layers 100 and the third circuit layers 300.

The multi-layer circuit board according to the exemplary embodiment may further include a patterned solder resist layer that protects the outer circuit layer formed on the outer surface of the first circuit layers 100 or the third circuit layers 300 and prevents an unnecessary part of the surface of the multi-layer circuit board from being soldered.

As described above, according to the above exemplary embodiment, the method of manufacturing a circuit board and the circuit board manufactured by using the method generate layers as much as necessary, thereby preventing materials from being overused, manufacturing a thin multi-layer circuit board, and reducing manufacturing cost caused by the overuse of materials.

Furthermore, according to the above exemplary embodiment, the method of manufacturing a circuit board and the circuit board manufactured by using the method may prevent warpage from occurring even if as many layers as necessary are generated.

Furthermore, according to the above exemplary embodiment, the method of manufacturing a circuit board includes a manufacturing process of attaching the circuit board onto both sides of a carrier layer that is heteromorphic with the circuit board, and thus two boards may be manufactured through one process, thereby enhancing productivity.

Furthermore, according to the above exemplary embodiment, the method of manufacturing a multi-layer circuit board may simultaneously process through holes and blind via holes, thereby enhancing productivity.

While the exemplary embodiments have been particularly shown and described above, it will be understood by one of ordinary skill in the art that various changes in form and details may be made therein without departing from the spirit and scope present inventive concept as defined by the following claims.

What is claimed is:

1. A method of manufacturing a circuit board, the method comprising:
    forming a second conductive circuit layer on a first surface of a second prepreg, the second conductive circuit layer having a centerline being parallel to the first surface of the second prepreg and dividing the second conductive circuit layer into an upper portion and a lower portion opposite to the upper portion;
    stacking a first prepreg on a first surface of the second conductive circuit layer; and
    forming at least one of a first circuit layer and a third circuit layer on at least one of a first surface of the first prepreg and a second surface opposite of the first surface of the second prepreg,
    wherein, in the stacking the first prepreg, the first prepreg and the second prepreg are in a semi-cured state and the first prepreg and the second prepreg flow between patterns of the second conductive circuit layer in the semi-cured state,
    wherein in the stacking the first prepreg, the second conductive circuit layer submerged into each of the stacked first and second prepregs is heated so that the first prepreg forms a first recessed portion and the second prepreg forms a second recessed portion,
    wherein the upper portion of the second conductive circuit layer is disposed in the first recessed portion and the lower portion opposite to the first portion is disposed in the second recessed portion, and
    wherein the first prepreg and the second prepreg are symmetrically stacked with respect to the centerline of the second conductive circuit layer protruding into each of the first and second prepregs after the submersion of the second conductive circuit layer;
    wherein the centerline of the second conductive circuit layer passes through a conductive material of the second conductive circuit layer.

2. The method of claim 1, wherein the first prepreg and the second prepreg having the same characteristics.

3. The method of claim 1, wherein the forming of the second conductive circuit layer comprises:
    forming a second conductive layer on the first surface of the second prepreg; and
    applying a subtractive process on the second conductive layer to form the second conductive circuit layer,
    wherein the second conductive layer is formed by stacking the second conductive layer on the second prepreg or plating the second conductive layer on the second prepreg.

4. The method of claim 1, wherein the forming of the second conductive circuit layer comprises: forming the second conductive circuit layer on the first surface of the second prepreg by using an additive process.

5. The method of claim 1, wherein between the stacking of the first prepreg and the forming of the first or third circuit layer further comprising:
    processing a via hole formed on at least one conductive layer, wherein
    a first conductive layer formed on the first surface of the first prepreg and a third conductive layer formed on the second surface opposite of the first surface of the second prepreg;
    curing the first prepreg and the second prepreg; and
    plating an inner surface of the via hole
    wherein the forming of the first circuit layer comprises: stacking and forming the first conductive layer and the first prepreg,
    wherein the forming of the third circuit layer comprises: stacking and forming the third conductive layer and the second prepreg.

6. The method of claim 5, wherein the processing of the via hole comprises:
    patterning the at least one conductive layer by using a subtractive process thereby the at least one conductive layer corresponds to a via; and
    forming the via hole by performing resin etching on at least one surface of the circuit board.

7. The method of claim 1, wherein the forming of the first and third circuit layer comprises:
    providing at least one of a first conductive layer on the first surface of the first prepreg and a third conductive layer on the second surface opposite of the first surface of the second prepreg; and
    forming the first and third conductive layer as the first and third circuit layer by using a subtractive process,
    wherein the first conductive layer is formed by stacking the first conductive layer on the first prepreg in the stacking of the first prepreg, and the third conductive layer is formed by stacking the third conductive layer on the second prepreg in the forming of the second conductive circuit layer.

8. The method of claim 1, wherein the first or third circuit layer is formed by using the additive process.

9. The method of claim 1, further comprising sequentially forming a third prepreg and a fourth circuit layer on a first surface of the first circuit layer or a first surface of the third circuit layer.

10. The method of claim 1, wherein each of the stacked first and second prepregs of the circuit board has the same thickness.

11. The method of claim 1, wherein each of the stacked first and second prepregs has a viscosity between 4,000 Pa·s and 10,000 Pa·s during the stacking the second prepreg.

12. The method of claim 1, wherein a maximum number of circuit layers included in the circuit board is three.

* * * * *